(12) United States Patent
Andle et al.

(10) Patent No.: US 8,530,825 B1
(45) Date of Patent: Sep. 10, 2013

(54) PIXEL STRUCTURE AND IMAGE ARRAY SENSORS USING SAME

(71) Applicant: Solarsort Technologies, Inc., Barrington, RI (US)

(72) Inventors: Jeffrey C Andle, Falmouth, ME (US); Shalom Wertsberger, Barrington, RI (US)

(73) Assignee: Solarsort Technologies, Inc., Barrington, RI (US)

( * ) Notice: Subject to any disclaimer, the term of this patent is extended or adjusted under 35 U.S.C. 154(b) by 0 days.

(21) Appl. No.: 13/685,691

(22) Filed: Nov. 26, 2012

Related U.S. Application Data

(60) Provisional application No. 61/701,687, filed on Sep. 16, 2012, provisional application No. 61/713,602, filed on Oct. 14, 2012.

(51) Int. Cl.
*G01N 21/25* (2006.01)

(52) U.S. Cl.
USPC ................................... 250/227.23

(58) Field of Classification Search
USPC ............... 250/227.23; 385/900, 116, 33–36
See application file for complete search history.

(56) References Cited

U.S. PATENT DOCUMENTS

| | | | |
|---|---|---|---|
| 331,043 | A | 3/1967 | Seney |
| 4,251,679 | A | 2/1981 | Zwan |
| 4,332,973 | A | 6/1982 | Sater |
| 4,409,422 | A | 10/1983 | Sater |
| 5,636,299 | A | 6/1997 | Bueno et al. |
| 5,930,433 | A * | 7/1999 | Williamson et al. .......... 385/116 |
| 6,323,833 | B1 | 11/2001 | Takeuchi et al. |
| 6,480,345 | B2 | 11/2002 | Kawashima et al. |
| 6,646,272 | B2 | 11/2003 | Rushbrooke et al. |
| 6,858,828 | B2 | 2/2005 | Roy et al. |
| 7,220,035 | B2 | 5/2007 | Buelow, II et al. |
| 7,799,988 | B2 | 9/2010 | Cutler |
| 7,902,453 | B2 | 3/2011 | Dutta |
| 7,943,847 | B2 | 5/2011 | Kempa et al. |
| 7,999,174 | B2 | 8/2011 | Moslehi |

(Continued)

FOREIGN PATENT DOCUMENTS

| | | |
|---|---|---|
| DE | 4409698 | 3/1994 |
| GB | 24584526 | 4/2012 |
| WO | WO2010076791 | 7/2010 |

OTHER PUBLICATIONS

"Plasmonic Rainbow Trapping Structures for Light Localization and Spectrum Splitting" Min Seok Jang and Harry Atwater, Physical Review Letters 107, 207401 (2011), Nov. 11, 2011, American Physical Society.

(Continued)

*Primary Examiner* — Seung C Sohn
(74) *Attorney, Agent, or Firm* — Shalom Wertsberger; Saltamar Innovations

(57) ABSTRACT

A pixel structure having a cladding and tapered core waveguide, the core dimensioned to refract EM radiation through the cladding at differing depth dependent on the wavelength of the radiation, and a plurality of detectors disposed to convert the band of radiation they receive into electrical signals. In some embodiments the detectors are disposed within lateral waveguides, and in some embodiments below the tapered core waveguide. Further disclosed is an image array sensor comprising a plurality of such pixel structures. Further disclosed is an array comprising stacked layered waveguides having detectors disposed therewithin, and a plurality of refractors to refract different bands of EM radiation into differing waveguides.

23 Claims, 6 Drawing Sheets

(56) References Cited

U.S. PATENT DOCUMENTS

| | | | |
|---|---|---|---|
| 8,212,217 | B2 | 7/2012 | Scherer et al. |
| 8,290,318 | B2* | 10/2012 | Vasylyev ............... 385/33 |
| 2005/0207699 | A1* | 9/2005 | Painter et al. .......... 385/32 |
| 2008/0047601 | A1 | 2/2008 | Nag et al. |
| 2009/0199893 | A1 | 8/2009 | Bita et al. |
| 2009/0301549 | A1 | 12/2009 | Moslehi |
| 2010/0155602 | A1 | 6/2010 | Scherer et al. |
| 2010/0202734 | A1 | 8/2010 | DeCorby |
| 2012/0006382 | A1 | 1/2012 | Dagli et al. |

OTHER PUBLICATIONS

"Visible-band dispersion by a tapered air-core Bragg waveguide" B. Drobot, A. Melnyk, M. Zhang, T.W. Allen, and R.G. DeCorby, Oct. 8, 2012 / vol. 20, No. 21 / Optics Express 23906, © 2012 Optical Society of America.

"Multi-Bandgap High Efficiency Converter (Rainbow)", Carol R. Lewis **, Wayne M. Phillips, Virgil B. Shields and Paul M. Stella, Ivan Bekey, Jet Propulsion Laboratory, Pasadena, California Institute of Technology.

"Trapping a Rainbow: Researchers Slow Broadband Light Waves With Nanoplasmonic Structures", Science Daily Mar. 15, 2011, www.sciencedily.com /releases/2011/03/110314152921.htm.

Nanoscale Devices for Rectification of High Frequency Radiation from the Infrared through the Visible: A New Approach N. M. Miskovsky, P. H. Cutler, A. Mayer, B. L. Weiss, Brian Willis, T. E. Sullivan, and P. B. Lerner Copyright © 2012 N. M. Miskovsky et al. Journal of Nanotechnology vol. 2012 (2012), Article ID 512379.

Extraordinary optical transmission through metal films with sub wavelength holes and "slits" , A. S. Vengurlekar, Tata Institute of Fundamental Research, Mumbai 400005, MS Completed in Oct. 2009, to appear in Current Science, J. of Ind. Acad Science.

"Efficiency and finite size effects in enhanced transmission through subwavelength apertures", F. Przybilla, A. Degiron, C. Genet, T.W. Ebbesen, F. de Léon-Pérez, J. Bravo-Abad, F. J.Garć ia-Vidal, L. Martín-Moreno. June. 23, 2008 / vol. 16, No. 13 / Optics Express 9571, © 2008 Optical Society of America.

"DOE Solar Energy Technologies program Peer Review" Harry A. Attwater, Nathan S. Lewis, Mar. 9-10, 2009 Denver, CO, US Department of Energy.

"Light transmission through perforated metal thin films made by island lithography", Mino Green, Futing Yi, 2004 Elsevier B.V. Available online Jul. 2, 2004.

"Trapping light in plasmonic waveguides", Junghyun Park, Kyoung-Youm Kim, Il-Min Lee, Hyunmin Na, Seung-Yeol Lee, and Byoungho Lee, Jan. 18, 2010 / vol. 18, No. 2 / Optics Express 598, © 2010 Optical Society of America.

"Stopping light by an air waveguide with anisotropic metamaterial cladding" Tian Jiang, Junming Zhao and Yijun Feng, Jan. 5, 2009 / vol. 17, No. 1 / Optics Express 170, © 2008 Optical Society of America.

"Light transmission through a single cylindrical hole in a metallic film" F. J. García de Abajo Dec. 2002 / vol. 10, No. 25 / Optics Express 1475 © 2002 Optical Society of America.

"Transmission of light through thin silver films via surface plasmon-polaritons", Armando Giannattasio, Ian R. Hooper, and William L. Barnes. Nov. 29, 2004 / vol. 12, No. 24 / Optics Express 5881, © 2004 Optical Society of America.

"Experimental verification of the "rainbow" trapping effect in plasmonic graded gratings" Qiaoqiang Gan, Yongkang Gao, Kyle Wagner, Dmitri V. Vezenov, Yujie J. Ding, and Filbert J. Bartoli.

US Office Action in sibling U.S. Appl. No. 13/726,044, Jun. 1, 2013.

"Trapping a Rainbow: Researchers Slow Broadband Light Waves With Nanoplasmonic Structures", Mar. 15, 2011, Page(s) www.sciencedily.com /releases/2011/03/110314152921.htm, Publisher: www.sciencedily.com.

A. S. Vengurlekar, "Extraordinary optical transmission through metal films with sub wavelength holes and slits", "Current Science, Journal of Indian Academic .Science", Oct. 2009, Publisher: Tata Institute of Fundamental Research, Published in: Mumbai, India.

United Kingdom Intellectual Property Office Search Report in GB 1222557.9, "Continuous Resonant Trap Refractor, Waveguide Based Energy Detectors, Energy Conversion Cells, and Display Panels Using Same", Feb. 1, 2013.

* cited by examiner

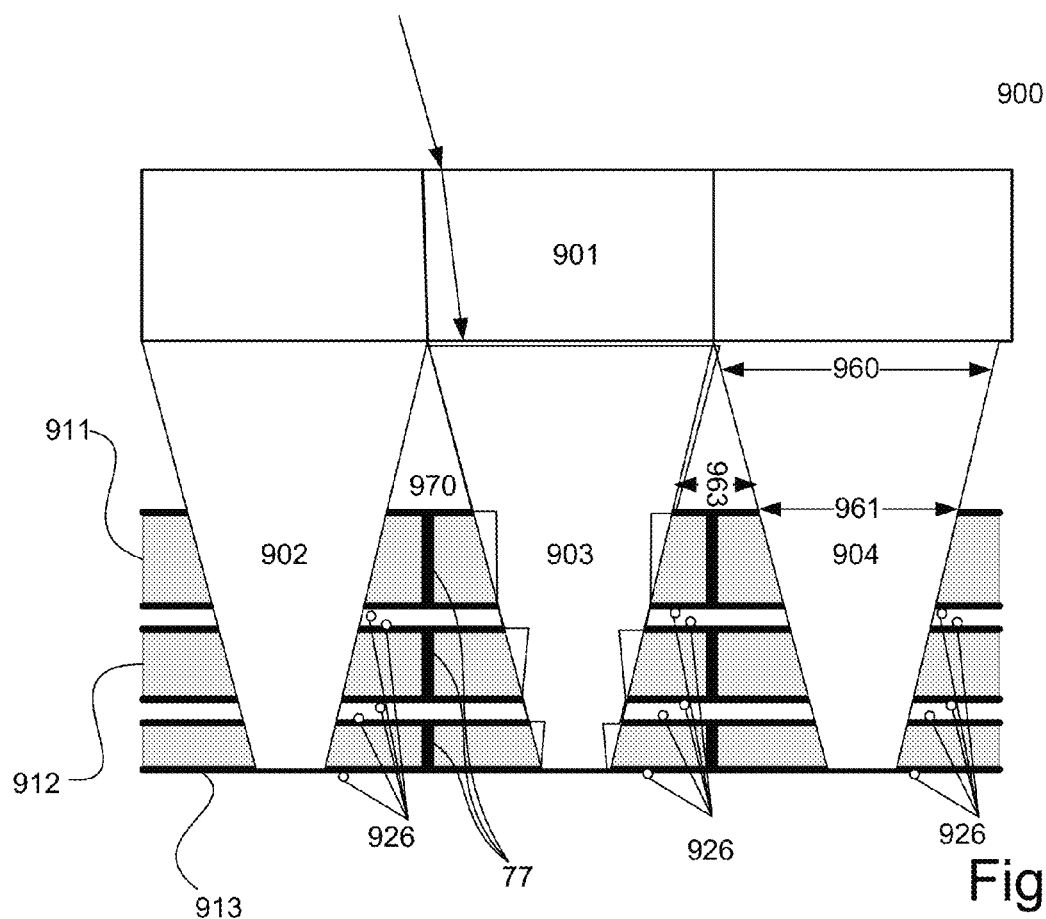
Fig. 3a
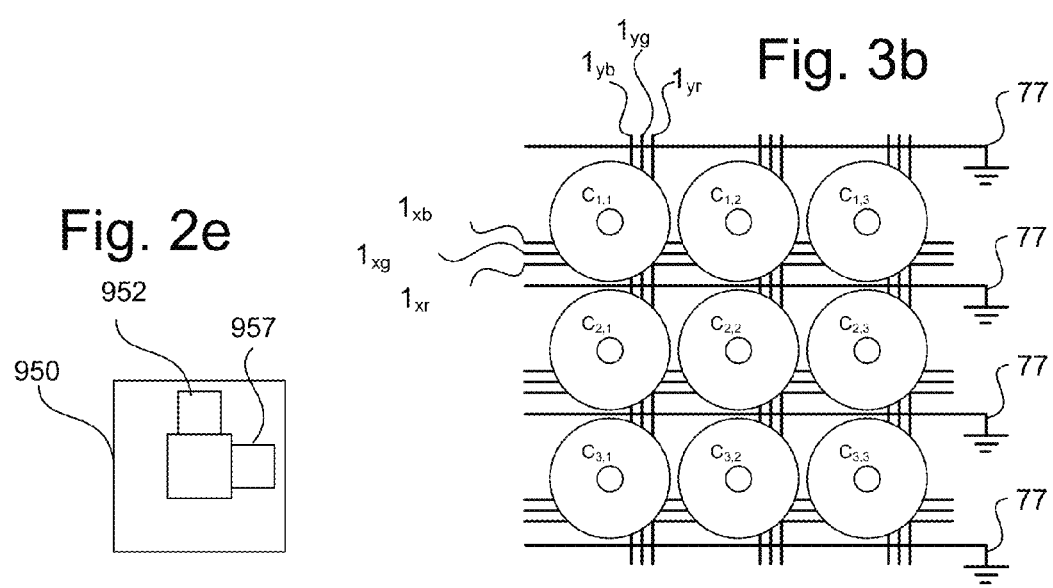
Fig. 2e
Fig. 3b

PIXEL STRUCTURE AND IMAGE ARRAY SENSORS USING SAME

FIELD OF THE INVENTION

The present invention relates generally to pixel structures and to image sensors and more particularly to image sensors utilizing resonance based polychromatic radiant energy refractors, and optionally utilizing light or other radiant energy detectors disposed within waveguides.

BACKGROUND OF THE INVENTION

Image array sensors are used extensively in fax machines, still or video cameras, sensors, scanners, telescopes and the like. The image array sensor field is dominated by two technologies, namely CCD (Charge Coupled Device) and CMOS (Complementary Metal Oxide Semiconductor). Sensitive, high pixel count sensors are expensive.

Light is one form of radiant energy which may be considered as an alternating electromagnetic radiation at very high frequency. Humans perceive different light frequencies as different colors, and there is a large amount of radiation that is not perceived by humans, generally known as UV (Ultra Violet), and IR (Infra Red), and the term light will be extended thereto. Visible light ranges generally between 760-300 nm and corresponds to the peak intensity of solar radiation transmitted through the atmosphere. Infrared radiation ranges from the extreme far end of 10 μm (33 THz; millimeter radio waves) to about 760 nm and solar radiation contains a significant amount of total energy below about 3 um. Terrestrial objects at temperatures above 300K have useable energy density at wavelengths below about 10 μm (frequencies above about 33 THz). Photons at wavelengths larger than about 10 μm have energies below about 0.125 eV and are widely considered impractical for photovoltaic detection, but may be detected and harvested utilizing electromagnetic principles.

UV radiation ranges between the visible light and higher frequency electromagnetic energy, such as X-Rays and gamma rays. While large amounts of UV energy are absorbed in the atmosphere, this radiation may still be of interest for harvesting above about 300 nm.

It is clear therefore that radiant energy as used herein covers a very broad spectrum of radiation. Clearly specific applications would be required to cover only portions of this spectrum. By way of example, for solar energy applications the spectral range of interest will likely be a spectrum containing most if not all of the solar spectrum available at the location where the solar cell is to be deployed, or the portion thereof which is economically used by the device at hand, typically 3 μm to 300 nm for example. The spectral range of interest for image array, focal plane sensors may vary from visible light only when used in cameras, to the infra-red and possibly to some part of the visible spectrum in heat sensing devices, to the whole spectrum in certain hyper-spectral applications. In some applications a specific wavelength may be desirably attenuated, such as by way of example reduction of blue light for pilot related devices. Yet, for devices directed to heat energy recovery, it is likely that only the infra-red portion of the spectral range is of interest. It is seen therefore that the application at hand determines the spectral range of interest for which an apparatus utilizing the invention is directed to.

Therefore, the spectral range of interest is defined herein as relating to any portion or portions of the total available spectrum of frequencies which is being utilized by the application and or apparatus at hand, and which is desired to be detected and/or emitted utilizing the technologies, apparatuses, and/or methods of the invention(s) described herein, or their equivalents.

For brevity and improved clarity the term 'light' as used herein is equivalently directed to being but one example of the frequency within the spectral range of interest, and inclusive thereof, unless specifically limited, such as 'visible light', infra red light, and the like.

Light may also be considered as a flow of photons, which are quantized units of energy which increases with frequency. Therefore certain terms that are common to simple electromagnetic energy need to be better specified as relating to the spectral range of interest. Thus, a dielectric material in the above mentioned energy spectrum may be defined as a material having low conductivity, and having a band-gap between a filled valence band and an empty conduction band exceeding the energy of any photon in the spectral range of interest to a specific application. A "semiconductor" refers to a photovoltaicly active material, having a bandgap comparable to or smaller than the photon energy of any photon in the spectral range of interest to a specific application. It is explicitly noted that a material that is a dielectric in one range of wavelengths may be an intrinsic semiconductor in a shorter wavelength region of the spectrum. Therefore the classification of a material as dielectric or semiconductor is determined by the structure and the frequencies at which it is intended to be used. Given the wide range of spectrum of interest in at least some applications the same material may be considered a dielectric in one location and a semiconductor in another.

In contrast, a transparent conductor is a material having a finite but meaningful conductivity due to a partially filled conduction band or partially empty valence band but having a band-gap between the valence band and conduction band exceeding the energy of any photon in the spectral range of interest. These materials act like a dielectric at some frequencies and like a semiconductor at even higher frequencies, but act like a conductor at low frequencies. Transparent dielectric materials also have low optical losses such that photons efficiently transmit through such material, at least at the spectral range of interest or a significant portion thereof for which they are employed.

While transparent conductors may be considered as wide bandgap semiconducting materials, they are used as conductors in most applications. Dielectrics, transparent conductors, and semiconductors, as used in these specifications, refer to materials that have a dielectric constant at optical frequencies; however the distinction between a semiconductor and the remaining materials is that the bandgap of a semiconductor is not substantially larger than the photon energy. As a general and non-limiting guideline, table 1 describes several characteristics of the different conductive, insulating, and semi-conductive materials.

TABLE I

| Material | Metal | Trans. Cond. | Semiconductor | Dielectric |
|---|---|---|---|---|
| Bandgap | → 0 | >> photon | ≦ photon | >> photon |
| DC Conductivity | high | good | Varies | → 0 |
| Optical Property | reflective | transparent | absorptive | transparent |
| Dielectric constant | complex | low loss | lossy | low loss |

The term stationary resonance condition should be construed as relating to a situation in a waveguide where the frequency of the guided wave is sufficiently close to the local cutoff frequency of the waveguide, such that the guided wave reflects repeatedly between opposing surfaces of the guide. The corresponding energy velocity along the waveguide propagation axis is significantly lower than the speed of light in the bulk material of the waveguide and approaches zero at the stationary resonance condition. Notably, complete stationary resonant condition is an ideal limiting case which is almost never achieved.

The term Continuous Resonant Trap Refractor (CRTR) should be construed as relating to a tapered waveguide having a base face and a tip. The larger face of the tapered waveguide core will be generally referred to as the aperture, and the smaller face, or point, will generally be referred to as the tip. Light travels along the depth direction extending between the aperture and the tip, however the light may travel towards the aperture, or away therefrom. For the purposes of these specifications, the depth increases from the aperture towards the tip, such that larger depth implies greater distance from the aperture. The term 'tapered waveguide' requires only that the waveguide core be tapered, and the overall dimensions or shape of the CRTR may be of any convenient shape.

A distance from the aperture along the depth dimension at which the width of the waveguide in at least one dimension would be the critical width which will block light of a given frequency from advancing further down towards the tip, is referred to in these specification as 'emission depth' for this frequency. The width of the CRTR core which causes the energy to be emitted through the cladding for a wave of a given frequency, is termed 'emission width' for that wave. Such emission is termed 'cladding penetration state'. When polychromatic light is admitted through the CRTR aperture, lower frequency waves will reach their emission depth before higher frequency waves. As the wave energy departs the CRTR at its emission depth, lower frequency light would penetrate the cladding and exit at a shallower depth than higher frequency light. Thus, the CRTR will provide spatially separated spectrum along its cladding. In addition the CRTR refracts the spatially separated light away from the axis of the CRTR extending from the aperture toward the tip.

Cladding penetration may be caused by the wave approaching stationary resonant condition, or when the wave reaches a critical angle which depends on the core/cladding interface. In certain embodiments cladding may be removed at a predetermined depth to achieve desired propagation characteristics.

Cladding may comprise a dielectric material with lower refractive index than that of the core, a thin conductive layer with thickness comparable to the skin depth of the conductor, or a conductive layer with perforations. Such cladding and core systems offer total internal reflection for sufficiently thick claddings. As the wave is slowed the equivalent incident angle of the wave against the core/cladding boundary increases and penetration into the cladding increases up to the critical angle. For intermediate cladding thicknesses Frustrated Total Internal Reflection (FTIR) occurs just before the critical angle. For sufficiently thick claddings the wave is bound until the critical angle. Metallic claddings with small perforations or with thicknesses at or near the skin depth also have angle dependent reflection coefficients, resulting in a situation analogous to FTIR, and are thus also considered suitable.

CRTR's were first described in U.S. provisional patent application No. 61/701,687 and later in more detail in U.S. provisional patent applications No. 61/718,181, and 61/723,832 to the present inventors. The 61/701,687, 61/718,181, and 61/723,832 patent applications are incorporated herein by reference in their entirety.

Individual devices for converting radiant energy to electric signals shall be generally referred to hereinunder as detectors. Commonly, detectors are closely coupled to a single pixel and correspond to a single color. An array sensor relates to a linear or an area array of pixels, each utilizing at least one refractor, preferably CRTR, and a plurality of coupled detectors, each detector directed at a specific color or color band, at one or more polarizations.

A common detector technology is photovoltaic (PV) which generally uses layers of different materials forming a PN or PIN junction at their interface. When exposed to a photon having energy equaling or higher than the band gap between the junction materials, the photon energy causes formation of electron-hole groups, which are separated and collected on both sides of the junction.

Another class of detectors employs polymer based photoabsorptive material as electron donors in combination with electron acceptors. In some cases the resulting excited electron is separated from the corresponding hole using different work function conductors. In other cases, a polymer electron acceptor forms a heterojunctions with the electron donor. Such detectors generally are less expensive than PV detectors, but have lower efficiency therefrom; however their efficiency may be significantly advanced by aspects of the present invention, so as to make them viable for the image array sensor applications. It is noted that the PN junction of PV detectors may be considered as an electron acceptor and electron donors materials respectively, even if the mechanisms by which the charges are separated may differ. Inserting an intrinsic layer between the electron donor and acceptor layer is a well known technique for increasing efficiency and directing energy level to its most advantageous location.

Other types of detectors utilize antennas, and more commonly rectennas, to achieve the energy conversion. The term rectenna relates to an antenna structure having a rectifier integrated with, or closely coupled to, the antenna, such that electromagnetic energy incident on the antenna is rectified and presented as primarily unidirectional (ideally DC) signal. By way of example, rectennas are described in U.S. Pat. No. 7,799,988 to Cutler, and in "Nanoscale Devices for Rectification of High Frequency Radiation from the Infrared through the Visible: A New Approach", N. M. Miskovsky, P. H. Cutler, A. Mayer, B. L. Weiss, Brian Willis, T. E. Sullivan, and P. B. Lerner, Journal of Nanotechnology, Volume 2012, Article ID 512379, doi:10.1155/2012/512379, Hindawi Publishing Corporation©.

Other detector technologies may be utilized. Charge coupled devices, photoresistors, phototransistors, reverse biased LED's (light Emitting Diodes), photoconductors, CMOS, and the like, are all possible selections for one or more detectors, and the selection of a specific detector is a matter of technical choice. Certain embodiments of the present invention utilize PV, polymer, and rectenna based detectors. Optionally the detectors are disposed within waveguides.

Presently, the two most prevalent image sensor technologies are CCD (Charge Coupled Device), and CMOS (Complementary Metal Oxide Semiconductor), with some combinations thereof. Color sensors are generally obtained by either filtering colors into adjacent pixels, in a technique known as Bayer Filter, by using multi-layered pixels or by utilizing three separate detectors.

Bayer filters utilize pixel filters of different colors laid over adjacent pixels. In the Foveon 3X© system (Foveon© Inc., Santa Clara, Calif., USA), three different layers are stacked on top of each other, each layer being sensitive to one primary color. The stacked detector layers of the same bandgap or of differing bandgap have been shown to improve efficiency and image quality over filter based image sensors. Detecting higher frequency signals in a first, higher bandgap material and transmitting lower frequency waves with photon energy below the material bandgap allows their subsequent conversion in lower bandgap materials allow better light capture, reduces color artifacts, and simplifies processing.

Three separate detectors are generally used in high end applications. Incoming light is separated to the three primary colors, either by filters, prisms, dichroic mirrors and the like, and each primary color impinges on a single detector dedicated to that color. The use of three detectors, combined with the color separation system increases camera size, and is expensive using presently available methods.

Waveguides are a known structure for trapping and guiding electromagnetic energy along a predetermined path. An efficient waveguide may be formed by locating a layer of dielectric or semiconducting material with a higher dielectric constant between neighboring regions with lower dielectric constants. It may also be formed by bounding a layer of dielectric or semiconducting material between two conductive layers. Waveguides are easily formed using simple wafer scale processes; however such waveguides guide light parallel to the surface.

There is a long felt and heretofore unsolved need for better technology, providing inexpensive, sensitive high quality image array sensors, and preferably sensor technology which may be made broad band, and/or polarization sensitive.

SUMMARY OF THE INVENTION

It is therefore an object of the invention to provide an image array device and technology directed to solving at least some of the shortcomings of current technology and answering at least some of the needs described above.

An array image sensor comprises a plurality of pixels. According to embodiments of the present invention, each pixel comprises a CRTR and detectors disposed about the CRTR. The CRTR has an aperture and a depth dimension extending from the aperture to the tip. The CRTR is dimensioned to admit light of shorter wavelength than a critical wavelength through the aperture, but as the CRTR taper progresses, increasingly shorter wavelengths will reach their cutoff frequency and/or their emission width at an emission depth. When light of a given frequency $F_r$ reaches its emission width, it penetrates the cladding and is emitted through the CRTR walls. Due to the taper of the CRTR core, increasing frequency waves will reach their cladding penetration state at greater emission depths. Thus the CRTR operates to sort the light and spatially separate it according to its frequency, and to refract the incoming light at a deterministic angle away from the CRTR depth dimension. The detectors are disposed about the CRTR such that each detector receives its own band of color. In certain preferred embodiments, the detectors are disposed in lateral waveguides. The CRTR is therefore an efficient channelized filter for electromagnetic radiation at least from IR to UV.

As image array sensors comprise a plurality of pixel structures, there is provided a pixel structure for sensing electromagnetic (EM) radiation within a spectral range of interest, the structure comprising:

a waveguide (CRTR) having tapered core with an aperture at its wider end for admitting the EM energy, and a depth dimension extending from the aperture towards the narrower end of the tapered core (the tip), the tapered core having cladding disposed thereabout, the core and the cladding both being transmissive of EM radiation within the spectral range and the cladding having a lower refractive index than the core;

the core tapered in at least one dimension, to cause EM radiation in the spectral range admitted via the aperture, to reach a cladding penetration state at depths depending on the wavelength of the radiation, such that a wave having a lower wavelength would be emitted via the cladding at shallower depth than a wave having a shorter wavelength;

At least two detectors positioned to receive radiation exiting from points at different depths of the cladding and serving to convert the EM radiation to an electrical signal, each of the two detectors producing an electrical output signal indicative of the intensity of a different band of wavelengths of the incident EM radiation lying within the spectral range of interest.

The CRTR core is dimensioned to allow the entry of the lowest frequency in the spectral range of interest, which means that the core taper in at least one dimension must encompass both the emission width of the longest wave in the spectral range of interest as well as an emission width of a shorter wavelength within the spectral range of interest. The CRTR either will taper to less than the emission width of the shortest wave in the spectral range of interest or will allow the final portion of the spectral range of interest to exit vertically at a truncated tip of the core. Larger widths than those emission widths at the inlet aperture, or smaller widths than those emission widths at the tip, are allowed.

The tip shape is selected from a point, a rounded shape, a flat tip, or any other desired form. Commonly, there is a larger plurality of detectors than the two detectors which are the minimum. Some of the plurality of the detectors are disposed to receive waves of different wavelength than some other detectors of the plurality of detectors. Thus detectors from the first group would receive different color bands from the other group. Additionally or alternatively, the at least one of the detectors may be disposed about the CRTR at different orientation from another detector, making one detector receive waves of different polarization than the other detector. Different polarization sensing is facilitated when at least a portion of the CRTR core has a symmetrical multi-faceted cross section, or an asymmetric cross section in a plane parallel to the aperture.

In some embodiments, at least one of the detectors is disposed within a waveguide.

The CRTR can be disposed within a plurality of stacked layers, wherein the depth direction is substantially normal to the local plane of layering of the stack. At least some of the plurality of detectors may be disposed within the layered stack. In such embodiments, it is preferable for the stack to form a plurality of waveguides, each disposed to receive waves of a frequency band from the CRTR, wherein the frequency bands impinged on at least two of the plurality of the waveguides being of different portions of the spectral range of interest. Optionally, at least one of the plurality of waveguides is dimensioned to have a cutoff frequency only slightly lower than the frequency of the lowest frequency wave impinging thereupon, so as to cause significant slowing of the energy propagation along the waveguide as compared to free space energy propagation. Such dimensioning may be further improved by having the cutoff frequency also being approximately equal to or slightly higher than the highest frequency of the waves impinging a waveguide located closer to the aperture. If the waveguide is the closest to the aperture, the skilled in the art will understand the principles of slowing the dimensioning the waveguide to sufficiently to slow the energy propagation along the waveguide into a desired factor of the propagation in free space. Reducing the energy propagation speed along the waveguide to at least the 90% of propagation in unrestricted core material of the waveguide is desired, requiring a cutoff frequency to be at least 40% of the frequency to be slowed. Additional slowing, such as to 50% or less, and even to less than 20% is a matter of proper dimensioning and thus it is a design choice. To obtain an energy velocity 50% of the unguided wave speed requires the cutoff frequency to be at least 86.6% of the frequency to be so slowed. This is a reasonable design goal with ±10% dimensional tolerance since the wave would still be admitted into the waveguide at the process limits. Obtaining 20% would require the cutoff frequency to be 98.7% of the target frequency and would require ±1% process tolerances, which are possible but typically not inexpensive.

The slowing factor is also the factor applied to the length required to absorb the guided wave. Therefore if 100 μ is required to absorb a given fraction of the photons in bulk material, a 50% slowing factor allows the same collection efficiency in 50 μ and a 20% slowing factor allows collection in only 20 μ.

Optionally at least one of the detectors is optimized for efficient conversion of the wavelength of waves impinging thereupon.

Optionally the core material comprises a fluid.

A By way of example, at least one of the plurality of detectors is selected from a group consisting of CCD detector, photovoltaic detector, CMOS detector, photodiode detector, phototransistor detector, polymer based detector, organic detector, die based detector, a rectenna based detector, or a combination thereof.

In certain embodiments at least one of the plurality of detectors is disposed below the CRTR.

In an aspect of the invention there is provided an image sensor array comprising a plurality of pixels having pixel structure as in any of the variations described above, or in any combinations thereof. The plurality of pixel structures are disposed about a surface.

Optionally the plurality of pixel structures are embedded within a stack of layered waveguides. Further optionally the plurality of detectors of at least one of the plurality of pixel structures is disposed within the waveguides.

In another aspect of the invention there is provided an image sensor array for sensing waves within a spectral range of interest, the sensor comprising:
a plurality of detectors for converting incoming waves of radiant energy into an electrical signal, the detectors being disposed within a plurality of stacked waveguides;
a plurality of refractors disposed to receive light from a surface substantially parallel to the layered stack, at least one of the refractors disposed to refract different portions of the incoming spectrum into different waveguides, so as to illuminate at least two detectors with either different portions of the spectrum or with light incident at different polarizations in the same portion of the spectrum.

Notably any refractor type, such as prisms, dichroic mirror filters, mirrors, lenses, and the like, may be utilized in this aspect of the invention and the location of the detectors within the waveguides provides all the advantages described in these specifications to provide a better sensor. The same type of detectors, including rectennas and the like, may be utilized In one specific combination of features described herein, there is provided an image array sensor for sensing a spectral range of interest, the sensor comprising:
a plurality of stacked layered waveguides;
A plurality of detectors for converting radiant energy into an electrical signal, the detectors disposed within the waveguides;
a plurality of tapered waveguides (CRTR), each having an aperture and a tip and a depth dimension extending from the aperture to the tip, the waveguide having a tapered core and cladding disposed thereabout;
the core being tapered sufficiently in at least one dimension to cause waves of the spectral range of interest admitted via the aperture to reach a cladding penetration state at varying depths depending on the wavelength of each wave, such that a wave having a lower wavelength would be emitted via the cladding at shallower depth than a wave having a shorter wavelength;
wherein the waves being emitted from the CRTR impinge on the plurality of detectors, such that the waves which impinge on at least one detector have different wavelength and/or polarization than the waves which impinge on another detector.

In some embodiments, an array of detectors are formed on a semiconductor wafer, an optical coating is applied thereover, and CRTR structures are formed in the optical coating such that the desired spectral components, sorted by frequency or polarization, are directed at the corresponding detectors.

As described, optionally, the detectors for different portions of the spectrum of interest, disposed within their respective waveguides, are superposed one on top of the other, while optionally the detectors for different polarizations of the same portion of the spectrum of interest are disposed at different angular alignments around the CRTR in the same waveguide in a symmetrically multi-faceted core. It is noted that the waveguides in this embodiment have their propagation direction being normal to the depth dimension of the tapered waveguide. A plurality of conductors is coupled to the plurality of detectors, throughout the sensor, to query each of the pixels relative to the character of light it receives, which may be done for any combination of its intensity, polarization, and color combination. In certain embodiments utilizing waveguide-based detectors, the waveguide sections associated with a first CRTR are reflectively isolated from those associated with a second CRTR.

In one embodiment a sensor is made in a planar form wherein the CRTR's are interposed within the stacked sheet of planar detectors. The sensor of this embodiment comprises a plurality of photoactive layers, forming a plurality of lateral waveguides, each comprising a lower cladding layer, an upper cladding layer and a core comprising at least one detector of the plurality of detectors interposed therebetween. In certain embodiments the lateral waveguide core comprises one electron donor layer and an electron acceptor layer and forming a detector. Additional layers, such as transparent conductive layers, intrinsic layer(s) between the electron donor and acceptor, and the like may also be disposed in the lateral waveguide. In certain embodiments one of the cladding layers of at least one lateral waveguide may be used as common electrode/ground plane. In at least some such embodiments at least one of the metal cladding layers is patterned to form signal traces with the gaps therebetween preferably dimensions so as not to be transparent to light bound by the waveguide. The layered waveguides with their respective detectors are formed as a sheet in certain embodiments. The sheet has a top surface and the waveguides are laid parallel to, or substantially parallel to the surface.

In some embodiments, transistors for signal amplification and switching are incorporated as thin film transistors in the semiconducting layers forming a portion of some of the waveguide. In other embodiments, vias connect the photodetector signals to related circuitry.

A plurality of separators is disposed within the waveguides to separate one pixel from another pixel of the plurality of pixels. Optionally the separators comprise liquid crystals, such that by changing the state of the liquid crystals a plurality of pixels are coalesced. Alternately the separators comprise conductive vias from a detector to related circuitry.

Optionally, the taper is not linear, thus allowing one method of constructing sensors with varying sensitivity to varying light frequencies.

Different sensors may be constructed for varying portions of the spectrum, or for the whole spectrum. Thus, by way of non-limiting example, if the desired spectral range of interest ranges from 700 to 400 nm and the core has a refractive index of 2, the aperture of the CRTR would be at least 175 nm in at least one dimension at a first cladding penetration depth and the taper would taper down to less than 100 nm at a final cladding penetration depth. Tapering to only 125 nm would narrow the range, but mostly imperceptibly for most persons. Tapering to 75 nm will increase the sensitivity of the violet and UV ranges. An aperture dimension of at least 375 nm would allow significant portions of the short wave IR band to be received in the CRTR, while a diameter of 750 nm would allow practically all of the short wave IR range. A 4.5 µm CRTR aperture for a core having an index of refraction of 2 would admit IR out to the 18 µm long wave IR bands. If it is desired to reduce the total sensitivity range of the sensor, the taper may be limited to intermediate ranges. It is noted that smaller taper rate will allow increase in the distance in which the admitted light is spread, allowing more accurate measurement, especially when combined with larger number of lateral sensors. Other dimensions will be clear to the skilled in the art.

In the embodiments utilizing dielectric cladding the preferred cladding thickness equals or is greater then one eight of the wavelength $\lambda$ at the wave emission depth. Thinner claddings may be employed; however the transition from total internal reflection to cladding penetration state is more gradual and the resulting refracted beam could become excessively diffuse. In the more preferred embodiments which use dielectric cladding the cladding thickness equals or is less than one half of the wavelength, $\lambda$. While thicker thickness of the cladding at the penetration depth is considered, it is less desirable and thickness equal to or greater than three quarter of the wavelength $\lambda$ are considered impractical.

For unperforated conductive cladding the preferred thickness is at least one skin depth and preferably no more than three skin depths at the wave emission depth. For perforated conductive cladding the thickness is a matter of a technical choice, however the perforation dimension could range between 1/10 to ½ of the wavelength at the emission depth.

In certain embodiments the core material comprises a fluid. Certain fluids offer excellent wetting ability, which overcomes many manufacturing defects. Certain fluids also provide excellent heat conduction characteristics, either to provide—for example—cryogenic or other cooling of a detector array for improved sensitivity in the IR spectrum, or simply to aid in conducting damaging heat from the image sensor. Finally, fluids are self-healing against many transient conditions, such as thermal cycling and the like.

In an optional aspect of the invention the sensor has a planar array of detectors disposed on a substrate. The substrate is disposed beneath an optical coating which includes an array of CRTR's, where the CRTR's refract light to some of the detectors of the planar array.

There is further provided a method of producing an image array sensor, comprising the steps of a) layering a plurality of layers to form a sheet, the layers comprise at least three waveguide based photodetectors, b) providing conductors to a plurality of zones within the sheet, c) forming a plurality of pits or holes in the sheet, d) coating the walls of the pits or holes with cladding material, and d) filling the holes with core material, such that the core is tapered in at least one dimension, and the core is dimensioned to admit light but to restrict its propagation to a point where it is emitted through the cladding layer to one or more photodetectors.

SHORT DESCRIPTION OF DRAWINGS

The summary, above, and the following detailed description will be better understood in view of the enclosed drawings which depict details of preferred embodiments. It should however be noted that the invention is not limited to the precise arrangement shown in the drawings and that the drawings are provided merely as examples.

FIG. 1 depicts a cutout of waveguide based detectors formed between two bounding layers.

FIG. 2a depicts a cutout of a simplified CRTR. FIG. 2b depicts the refractor with an enlarged aperture for improved collection area. FIG. 2c depicts a CRTR based pixel with a silicon substrate system, while FIG. 2d depicts an example of multifaceted CRTR based pixel in a layered detector system. FIG. 2e depicts a top view of a square CRTR for polarization dependent detection.

FIG. 3a illustrates a vertical cutout view of a portion of the sensor, including an optional frequency selective coating over an array of CRTR's with waveguide detectors. FIG. 3b depicts a top view of a portion of the array image sensor.

DETAILED DESCRIPTION

Certain embodiments of the invention will be described herein by way of example to increase the understanding of different aspects of the invention.

Figure 1:
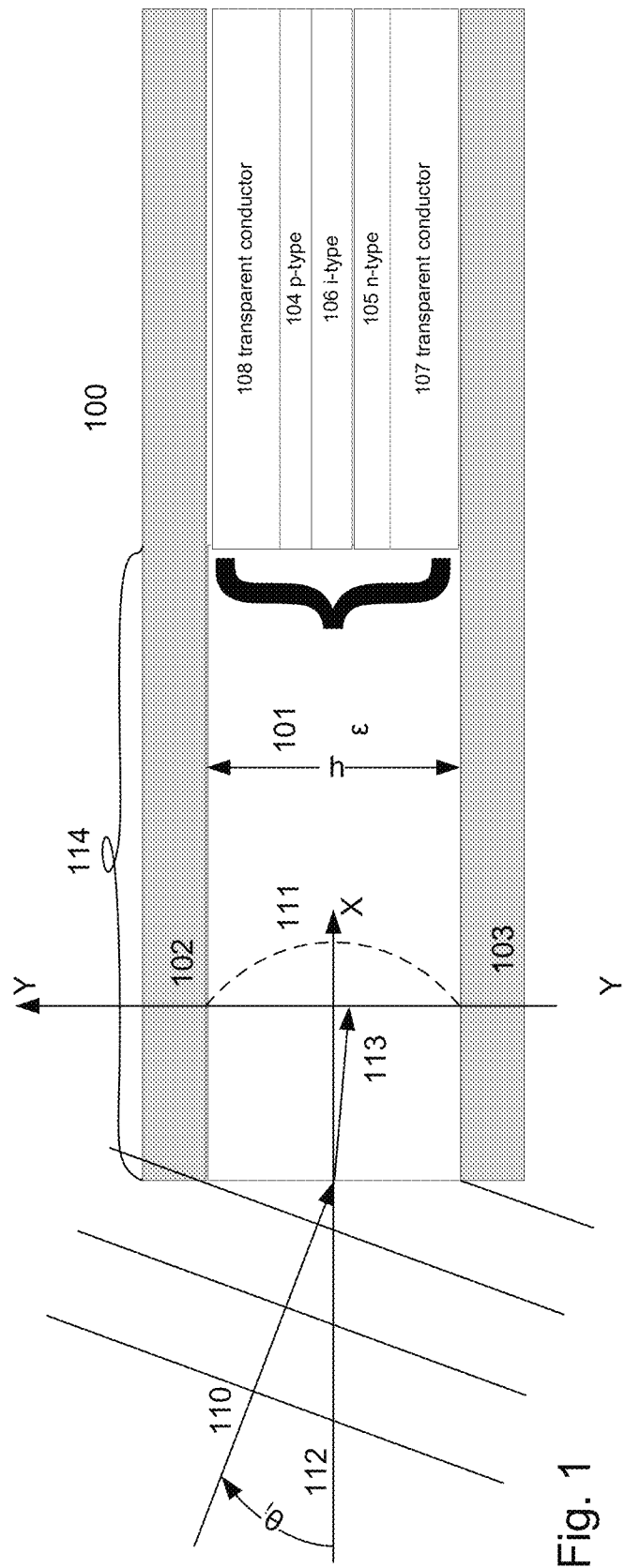

FIG. 1 depict a short region of waveguide with insignificant variation of thickness within a CRTR, or a short region of a lateral waveguide containing a detector, and is provided for simple explanation of the propagation characteristics of radiant energy within such waveguides, as well as for showing an construction of optional detectors.

FIG. 1 shows a waveguide 100 comprising a waveguide core material 101 of thickness, h, formed between conductors 102 and 103. Alternately the waveguide core material 101 could be replaced by a plurality of layers forming an aggregate optically equivalent to a uniform material having dielectric constant, $\epsilon$, and the same overall thickness. In constructions using a plurality of layers, the section 114 may be eliminated, and a waveguide based detector is formed by the various layers shown. It is noted that while for brevity and clarity the discussion relates to a conductor cladding, the skilled in the art would recognize that dielectric cladding may be equivalently utilized, with minor changes to the principles of operation.

A portion of such an aggregate waveguide core region may contain a detector and, in some embodiments, forms a photovoltaic detector comprising an electron acceptor region 104 and an electron donor region 105. Optional intrinsic region 106 therebetween may exist in some embodiments. Optional transparent conductor regions 107, 108 also exist in some embodiments. The purpose of optional transparent conductors 107, 108 is to provide a vertical electrical contact to overlying and underlying metal while allowing the waveguide height to be optimized for frequency while the semiconductor thickness is optimized for pixel value reading efficiency.

The plurality of layers may comprise positively and negatively doped semiconductor materials, varying polymeric materials including dye sensitized semiconductor, photoabsorptive electron donor and acceptor layers, and intrinsic materials. The detectors may also comprise a plurality of tuned antennas or rectennas. Further detectors may comprise CCD, CMOS, photo diodes, photo transistors, photo resistors, organic junctions, and the like. Lateral waveguides which include detectors provide a compact manner which is easy to manufacture, but are not mandatory for all embodiments. For brevity, the following specification would assume a photovoltaic detection structure, unless otherwise specified or is clear from the context.

Insertion of radiant energy 110 along the interface between two layers, i.e. nominally perpendicular to the direction of photovoltaic current, provides short diffusion lengths from the photoabsorptive material to the junction, allowing efficient collection of charge carriers and minimizing recombinant losses and noise. It also provides long optical paths for efficient photoabsorption and concentrates the photon flux close to the photoabsorptive region. In a p-n junction construction, the perpendicular insertion direction increases efficiency by concentrating energy close the junction. Therefore the total efficiency of the sensor is enhanced.

Collectively regions 104-108 comprise an aggregate waveguiding region. Aggregate waveguiding regions may be considered to have an average relative dielectric constant, $\epsilon$, determined using formula well known in the art and resulting in a speed of electromagnetic plane wave propagation in the bulk of the material, $V_b = 300*10^6/\sqrt{\epsilon}$ meters per second. It is noted that $\sqrt{\epsilon}$ is the refractive index (commonly denoted as 'k' in semiconductor manufacture field, and as 'n' in the field of optics). In most cases, bounding layers 102, 103 are conductors, providing mirror reflection. This is especially desirable to maximize fill factor and reduce thermal noise in the semiconductor detectors by reducing the series resistance of the detector.

The waveguide will have a cutoff frequency, $F_{CN}$, below which energy may not proceed along the X direction. For the $N^{th}$ order mode it is obtained as $F_{CN} = NV_B/2h$ wherein N is the mode order Below this cutoff frequency an electromagnetic wave cannot travel laterally along the waveguide X axis. At the cutoff frequency, a guided plane wave reflects repeatedly between the upper and lower cladding but makes no lateral progress along the waveguide. In a tapered waveguide, such as a CRTR tapered waveguide, with properly selected material and dimensions the wave will reach its cladding penetration state and depart a CRTR tapered waveguide via the cladding, at close proximity to the location where the tapering of the CRTR core width would have raised the local cutoff frequency above the desired wave frequency.

Waveguides may also be constructed with dielectric or semiconductor cladding rather than with conductor cladding. In such cases, guided waves will reach the cladding penetration state and exit the CRTR before they reach resonance depth, as the wave angle relative to the cladding reaches a critical angle exceeding the total reflection propagation mode.

A wave at very high frequencies relative to the waveguide's cutoff frequency will travel effectively at the speed of light with a very low angle relative to the propagation axis of the waveguide. Such a wave has a very shallow angle of incidence on the boundaries of the waveguide and is said to have grazing incidence. A wave at about six times the cutoff frequency has an angle of incidence of about 10° and travels at effectively the speed of light in the waveguide core material. At lower frequencies, the angle steepens and the forward component of wave speed appears to slow compared to the speed of light. While the speed of light remains constant, the light bounces between the cladding layers with little forward progress (Generally known as energy velocity). When the cutoff frequency is 86.6% of the wave frequency, the energy velocity along the guide is half the speed of light at the core material and the incidence angle at the core/cladding boundary is approximately 60°. When the cutoff frequency is 98.7% of the wave frequency, the energy velocity along the guide is one fifth the speed of light and the incidence angle is approximately 80°.

Figure 2A:
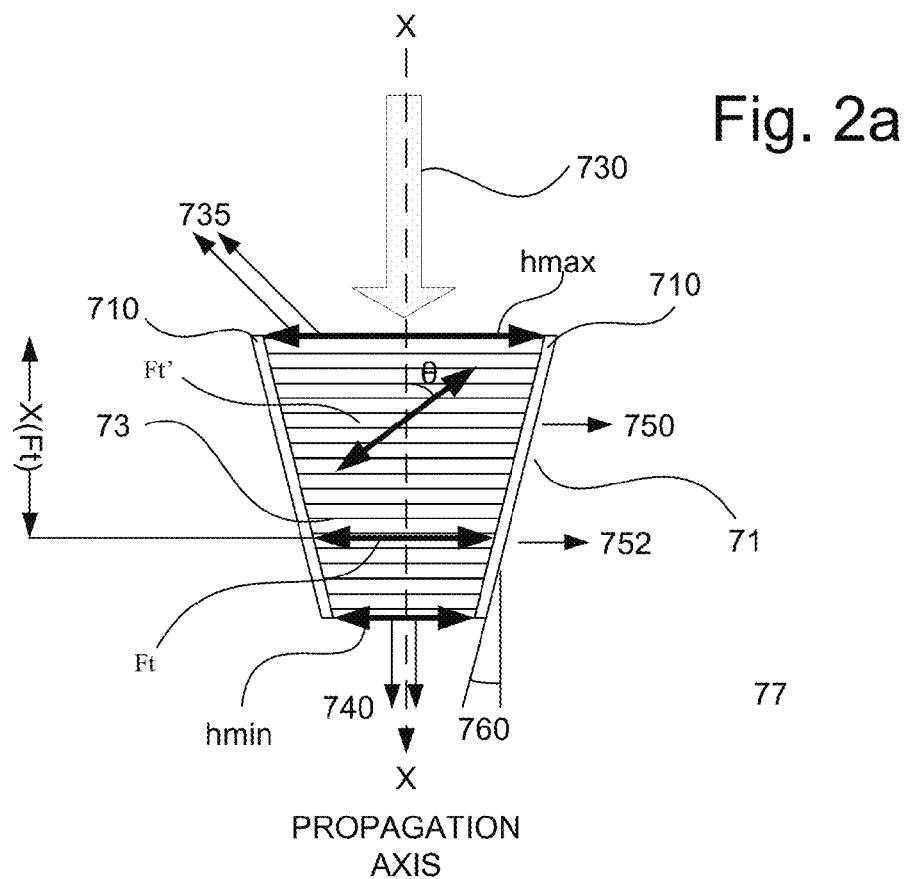

FIG. 2a depicts a simplified example of CRTR which is based on a tapered waveguide 71, with simplified wave propagation depicted therein. The CRTR comprises a transparent dielectric material based core 73, bounded between cladding walls 710, which are either conducting or having a lower refractive index than the index of the core. The core region may comprise a plurality of dielectric regions, and in some embodiments a fluid is utilized.

The depth dimension X-X extends from the aperture towards the tip, and grows in that direction. At its aperture the waveguide core has a width $h_{max}$, and thus the lowest cutoff frequency $F_{min}$. At the tip the waveguide width $h_{min}$ dictates a higher cutoff frequency $F_{max}$. In a smooth tapered waveguide, the cutoff frequency is continually increased between the wide aperture and the narrow tip due to the reduced thickness. Polychromatic radiant energy 730 is incident the waveguide at its aperture, at an angle which permits energy admission. Waves having a lower frequency than the cutoff frequency $F_{min}$ are reflected 735. Waves 740 having frequency higher than $F_{max}$ exit through the waveguide, if an exit exists. Alternately, the truncated tip may be made reflective such that above a maximum frequency, light is reflected back out the CRTR aperture and not absorbed as heat. Also alternately waves that exit may be detected in a detector located directly under the tip. Waves having frequencies between $F_{min}$ and $F_{max}$ will reach their emission width, and thus their cladding penetration state, at some emission depth depending on their frequency.

Thus, examining the behavior of a wave of arbitrary frequency $F_t$, where $F_{min} < F_t < F_{max}$, which enters into the waveguide at its aperture at an incidence angle parallel to the propagation axis X-X, the angle $\theta$ between the wave and X-X will vary as the wave propagates along the X-X axis as depicted schematically by $F_t$. This occurs due to the narrowing of the waveguide core and the increase of the cutoff frequency. As the wave approaches emission depth X(Ft) where the tapered waveguide cutoff frequency equals or nearly equals $F_t$, or the angle $\theta$ approaches the critical frequency $\theta_C$, the wave can not propagate any further within the CRTR core. The wave $F_t$ is thus either radiated through the dielectric cladding of the waveguide or is trapped in resonance at depth $X(F_t)$ in a metal clad waveguide. Stated differently, the wave of frequency $F_t$ reached its cladding penetration state at the emission depth dictated by the emission width of the tapered waveguide core in at least one dimension perpendicular to the depth direction of the CRTR. As the tapered waveguide will have a steadily increasing cutoff frequency with decreasing width, energy entering the CRTR aperture would be directly radiated from the tapered core via the cladding after reaching the cladding penetration state at the frequency dependent emission depth X(F), or will be transmitted through the CRTR if it has an exit and the frequency is greater than $F_{max}$. Thus spatial separation of the light occurs in relation to the distance from the waveguide aperture.

For a continuum of entering waves of different frequencies $F_{min}<F_1, F_2, \ldots F_x<F_{max}$, entering the aperture of the tapered waveguide 71, it becomes a Continuous Resonant Trap Refractor (CRTR) in which the different frequency waves are either emitted upon reaching a critical angle for cladding penetration or become standing waves, trapped at resonance at an emission depth in accordance with their frequency. Such trapped waves are either leaked through the cladding by the finite probability of tunneling though the cladding or are lost to absorption in the waveguide. In most if not all practical cladding materials the light will refract when entering and exiting the cladding. The emitted rays 750 and 752 will exit at a predetermined angle determined by those refracting angles.

Ideal behavior of a CRTR may be modeled in more detailed fashion as a series of successively narrower uniform waveguides provided that the rate of taper is slow compared to the wavelength, regardless of the function describing the taper. In other words, if the angle of taper 760 is made sufficiently small, then the local effect of the cladding walls 710 on the trapped wave is similar to a wave trapped between parallel walls of the waveguide, even though the guide is continually narrowing.

It is noted that the CRTR tip may taper to a point, a round, a flat bottom, or otherwise end in various forms (not shown). The tip may or may not allow waves to exit therefrom, as a design choice. The skilled in the art would also recognize that while this simplified explanation describes waves entering the CRTR in parallel orientation to the X-X depth axis, the operation will be similar on waves having any angle of incidence which is permitted by the waveguide construction.

Figure 2B:
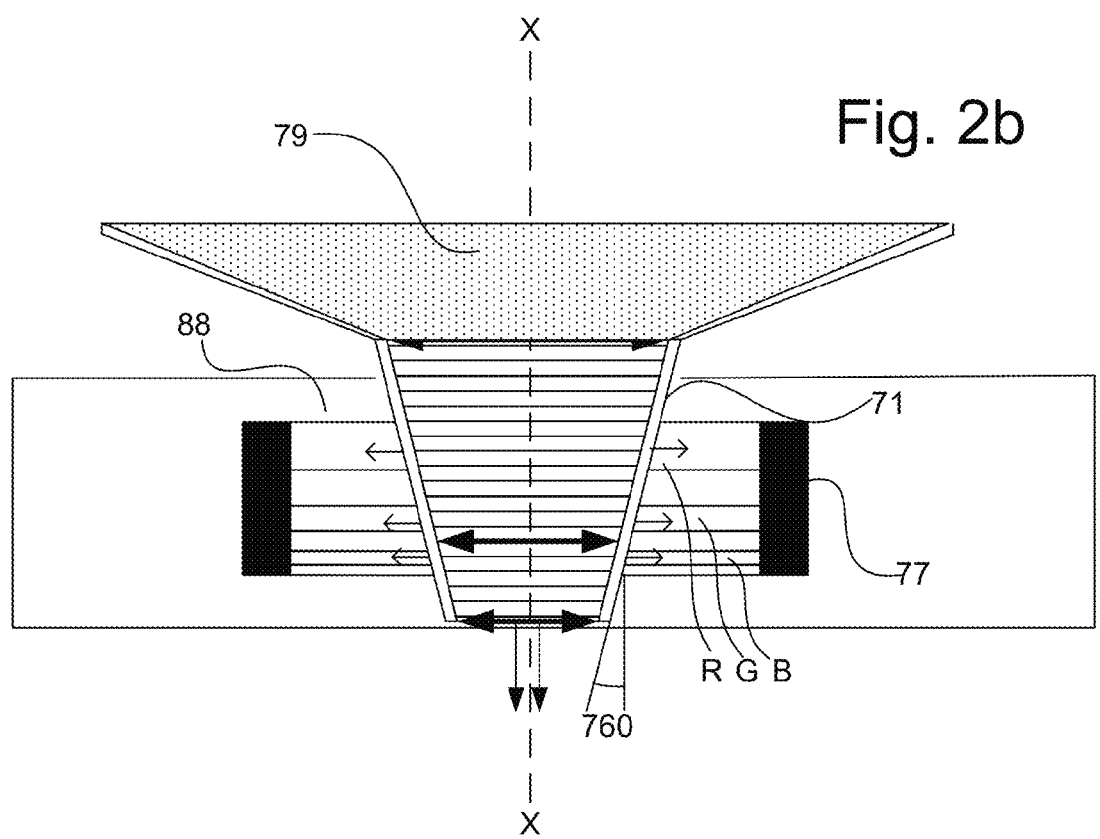

FIG. 2b depicts simplified example embodiment of a pixel in an image array sensor. The sensor comprises a plurality of pixels. Each pixel comprises of tapered core waveguides 71, surrounded by a plurality of detectors disposed in lateral waveguides 88 which will receive the spectrally separated refracted energy. An optional additional waveguide 79 may be utilized to guide incoming waves from larger entry area and/or from varying incidence angles, into the aperture of the CRTR 71. The CRTR aperture or the additional waveguide may be dimensioned at any convenient size above the cutoff frequency, and therefore a small pixel size is supported, allowing larger pixel densities as compared to current array image sensor technology. Additional waveguides may be created by optical fibers to allow detection with a probe.

Preferably the lateral waveguides 88 are superimposed in order to form a stack of detectors. The detectors are arranged to receive the energy from the CRTR such that a detector optimized for a specific frequency is located at, or adjacent to, the position where the wave of that frequency exits the CRTR cladding. It will be clear that unless infinitely thin, each detector would receive a band of light adjacent to the frequency of interest, however to increase readability, the description will relate to the wave entering the detector as a photon or a wave having a single frequency.

Preferably, each detector is constructed to most efficiently utilize the energy of a certain color; however, frequency efficiency optimized construction is not mandated. Such efficiency tuning may be obtained by proper material selection for the energy of the wave, and if a waveguide based detector is utilized, by proper selection of the waveguide dimensions. Optimizing the waveguide dimension is done by selecting a waveguide thickness to have a cutoff frequency which is but slightly lower than the frequency of the longest wavelength of the energy which will impinge upon the waveguide from the CRTR. In such optimized waveguide, the incoming wave would be able to enter, but will have a propagation speed that is significantly slower than the speed of light of the wave in free space. While reducing the propagation speed to less than 50% of the speed of light in free space is desired, smaller or larger reduction, ranging at any desired range between 90% and an almost stationary wave is considered sufficiently significant, and the term sufficiently slower should be considered to extend thereto. Clearly the higher the reduction of propagation speed, the effective length of the detector increases, as the wave has many more opportunities to be detected.

By way of non-limiting example, assuming a typical semiconductor index of refraction of 2, the stacked waveguide based detector thicknesses might vary from slightly more than 70 nm to slightly more than 700 nm for cutoff frequencies corresponding to light with free space wavelengths of 280 nm to 2.8 μm, so as to only allow fundamental waveguide modes at the target frequencies while offering some margin for the cutoff frequencies. The amount by which the thickness exceeds the critical thickness determines the propagation constant of the guided wave in the lateral waveguide. Waves closer to the critical frequency propagate more slowly and interact more with the waveguide layer per unit width but have less tolerance to manufacturing variations.

A decided advantage of the described image array sensor using detectors in waveguides is that carriers have extremely short vertical electrical path lengths to the junction, while laterally guided photons have an arbitrary interaction length with the semiconductor and are guided at an energy velocity substantially less than the free space speed of light. Internal quantum efficiencies will almost always approach unity and will be limited by the quality of the semiconductor itself. In many cases the junction depletion will approach the waveguide thickness. Photon capture probability will approach unity as well, provided the design of the CRTR and the layering of the lateral waveguide based detectors are adequately balanced, especially when pixels are delineated by reflective separators, forming resonant cavities from the reflectively terminated sections of waveguide. Such construction offers wider design selection of dimensions and electron donor/acceptor materials to increase the total efficiency of conversion. Use of properly sized waveguide allows use of smaller detectors which are less prone to noise, and allow material saving, without compromising sensor sensitivity. The shorter vertical electrical path and reduced resistivity offers even more reduction in noise and increased efficiency.

It is further noticed that the CRTR based pixel construction allows small pixel size, but as the light is separated to its components, no Bayer filtering is required, and the pixel construction provides higher efficiency than the Foveon system, as light is directed directly to its specific color detector, without having to pass through other detectors.

In certain embodiments, polymer and dye type waveguide based detectors (also commonly known as 'organic' detectors) provide significant cost savings. Utilizing the principle of single moded waveguides matched to the bandgap of a polymer based detector allows utilization of very thin photo-absorptive electron donor layers in close proximity to the electron donor/acceptor layers, which increases the efficiency of such pixels sufficiently to be used in image sensors. Thus, due to the increased efficiency stemming from the principles described above, polymer based array sensors may be provided at significant cost savings.

Figure 2D:
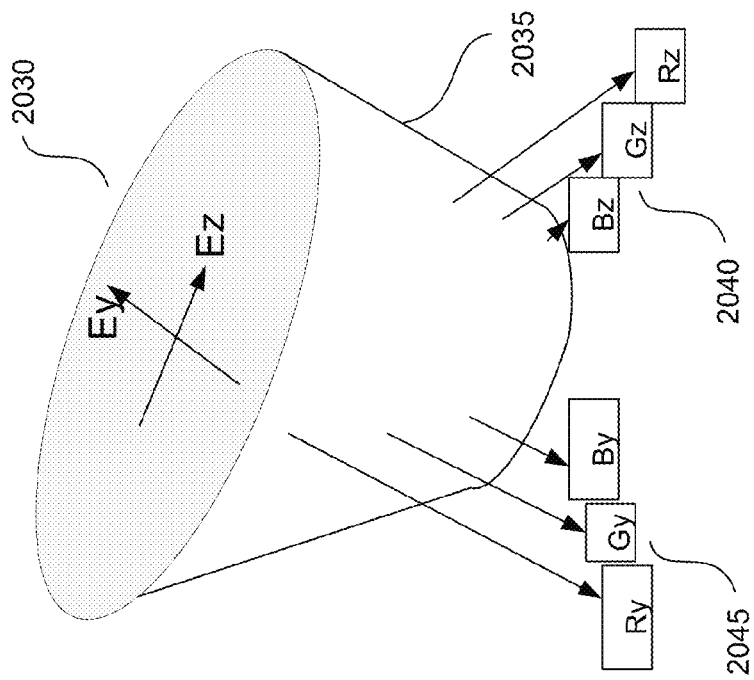
Figure 2C:
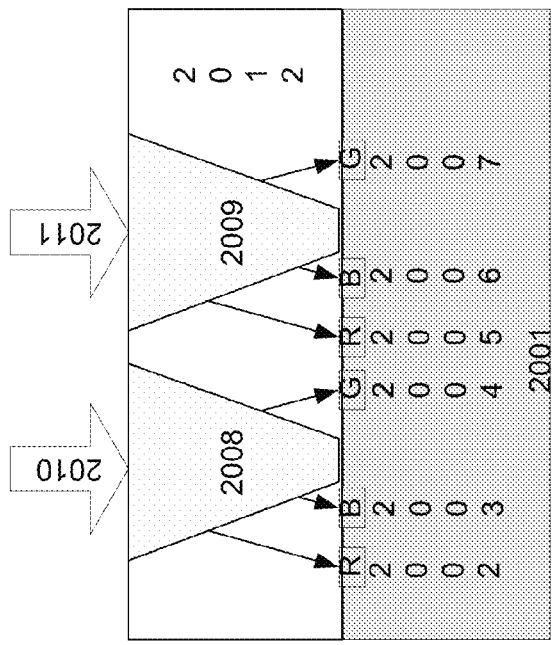

FIG. 2c illustrates an alternate embodiment in which a planar array of detectors is disposed on, by way of non-limiting example, a silicon wafer 2001 and a CRTR array is disposed thereupon. Light 2010 incident on CRTR 2008 in overlayer 2012 is separated by color with red light reaching a first emission depth and irradiating detector 2002; green light reaching a second emission depth and irradiating detector 2004, and blue light finally reaching an emission depth and irradiating detector 2003. Second, adjacent CRTR 2009 is illuminated 2011 and refracts red light to detector 2005, green light to refractor 2007, and blue light to detector 2006. The figure illustrates, by way of nonlimiting example, the refraction at about 40° from the CRTR axis as might occur using a parylene-N cladding and silicon nitride core and optical overlayer. While 40° is not perpendicular to the CRTR depth axis, it is within the meaning of "substantially perpendicular" since the emitted signal travels away from the CRTR. While the stacked detectors clearly minimize pixel size, the arrayed detectors of FIG. 2c are simpler to manufacture, and may be better fitting for certain applications. It should be noted that while red and blue detectors are shown to the left of the CRTR and green to the right, the refracted bands are annular with approximately the same shape as the CRTR core. In some embodiments it will be desirable to dispose annular detectors and in others collection efficiency will be sacrificed for smaller size, as shown.

Circular CRTR apertures offer polarization independent capture into conical waveguides and polarization independent refraction with regards to cladding penetration depth. If desired, other shapes such as elliptical, rectangular, and other geometries may be used to provide the detector with polarized response, if such is desired. Square and hexagonal apertures approximate circular apertures while maximizing packing density. It will be obvious to the skilled in the art that any shape can be implemented and the selection of shape is a technical choice that must be based on the remainder of the desired array sensor characteristics.

In certain embodiments, the tapered waveguide aperture is asymmetrical. If an elongated shape such as an elliptical, rectangular or similar cross section is employed for the CRTR, the light polarized parallel to the major axis will reach a cladding penetration state depth further from the aperture than light of the same frequency polarized parallel to the minor axis. There is thus provided an imaging pixel and arrays thereof in which polarization-dependent imaging may be accomplished simultaneously for both polarizations and all desired primary colors using detectors in different waveguide layers for the different polarizations of the same frequency. FIG. 2D depicts a simplified diagram of a pixel having a CRTR of elliptical cross section at a normal anglee to the depth direction of the CRTR, by way of example of but one possible asymmetrical CRTR 2035. Light of polarization Ey would enter the CRTR aperture 203, and would exit the CRTR and impinge on detector group 2045, while light entering the CRTR with polarization Ez would impinge on the detector group 2040.

Geometries other than elongated CRTR cross-sections are also considered to achieve polarization sensitivity. FIG. 2e represents an example of a multifaceted symmetrical CRTR core. Using multifaceted core such as square, hexagonal, octagonal shapes and the like provide a multi-polarization sensing pixel in which the varying polarizations refract into the same waveguide layer for a given frequency, but at different angular locations around the CRTR. FIG. 2e depicts a CRTR having a square core 950, and sensors 952 and 957 which will detect light at respective 90° polarization to each other. The skilled in the art would readily recognize that a hexagon would provide light polarization information at 120° increments and octagonal would provide 45° relative polarization separation, and the like. Clearly the light energy will be supplied from the light admitted to the CRTR and the light energy is divided between the different detectors or detector groups. While the term detector group is utilized, it will be clear that the term may extend to a monochromatic detector as well, and that the group detecting different colors is optional.

FIG. 3a depicts a cross-section of a portion of an embodiment of an array image sensor 900. CRTRs 902, 903, and 904 are contiguous or nearly contiguous at the aperture surface, providing effectively complete detection of incident light. The layered stack of lateral waveguides is extended with material 970, allowing the CRTR length to be extended. By making the apertures 960 of the CRTRs wider than the critical width at the lowest frequency of interest, $F_{MIN}$, 961 all desired frequencies are accepted into the waveguides and all frequencies are accepted in a narrowed cone of acceptance angles. As the CRTR cores taper, there exists space therebetween 963 for waveguides 911, 912, 913. Cover layer 901 provides protection to the underlying structure.

Optionally the CRTR core may follow a stepped geometry, as depicted for example in CRTR 903. Providing such stepped core may be desired if concentrating color bands into a more concentrated exit points, or additional reflections are desired.

Conductors 926 are provided for receiving signals from the detectors of individual pixels and also form the upper and lower bounds of the lateral waveguides. Separators 77 are disposed between individual pixels. The separators may be opaque or may comprise optical switches or modulators, in which case control conductors are also provided (not shown). Optical switches may be provided to dynamically combine a plurality of pixels. Such switches may comprise LCD material, mirrors, and the like. In some embodiments, the separators are conductors, and are used as common electrode for the detectors, may provide vias to signal processing circuitry in the substrate, or may be grounded. However, the separators are expected to be reflective in most applications, so as to better reflect non-absorbed light into the detector while separating the light from the detectors of adjacent detectors.

FIG. 3b depicts a simplified top view of a portion of an image array sensor. CRTR's C1,1, C1,2, . . . C3,3 are arranged in a matrix. Each CRTR corresponds to a single pixel. Sensing conductors 1xb, 1xg, and 1xr are disposed across the X axis of the array, while sensing conductors 1yb, 1yg, and 1yr are disposed along the Y axis of the array. The output of each of the three color detectors of C1,1 may be read by measuring the signal strength between 1xb-1yb, 1xg-1yg, and 1xr-1yr, respectively. The skilled in the art will recognize that output measurement of any detector in the array may be measured between any appropriate sensing conductor pair, and if desired wires of a plurality of detectors may be used in common.

Figure 4:
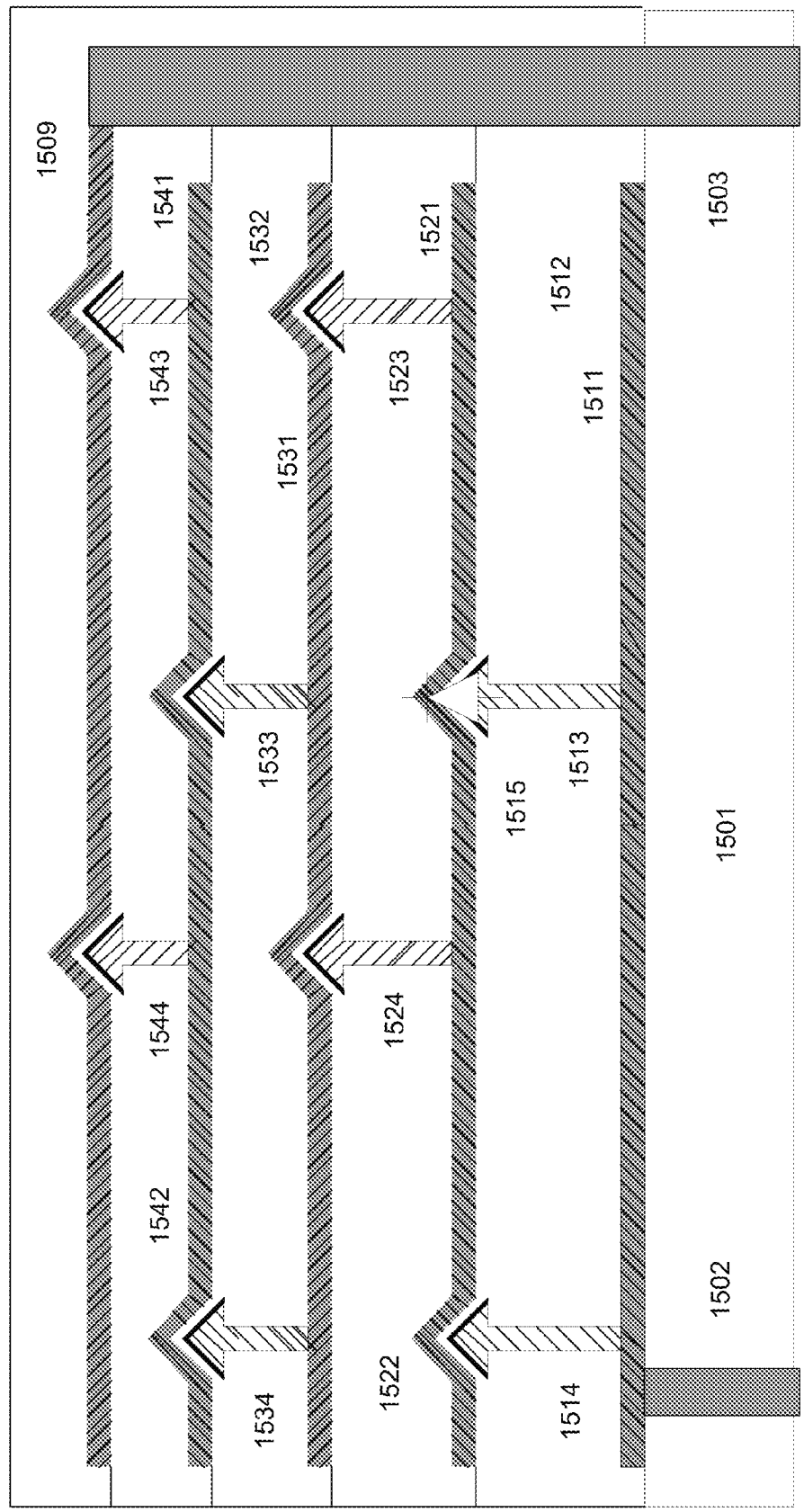
FIG. 4 depicts simplified rectenna based detectors.

In certain embodiments rectenna based detectors are utilized. Rectennas are very efficient at longer wavelengths such as the IR range. The detector consists of a plurality of thin, conducting elements being nearly an integral number of half-wavelengths long, suspended between two conductors. FIG. 4 depicts a stacked array of dielectric layers 1512, 1522, 1532, 1542 between conducting layers 1511, 1521, 1531, 1541 where the layer thicknesses are optimized for a succession of different detection frequencies. Antennas 1513, 1514, 1523, 1524, 1533, 1534, 1543, 1544 are tuned to capture a photon or a wave as a resonance of the antennas. At least one connection between each of the conducting elements and the conducting layers forms a rectifying junction 1515. The arrangement is placed on substrate 1501 with DC electrical contacts 1502 and 1503. Optional passivation layer 1509 at least partially encloses the detector. Rectennas may be the solution of choice for low IR (Infra Red) frequencies. One skilled in the art will recognize how such layers of rectennas may be arrayed surrounding CRTR to form the detector arrays, whether or not such rectennas are arranged within the stacked waveguides or not. Any combination of rectennas and other detectors will also be clear to the skilled person, in view of the teachings provided supra.

Figure 5:
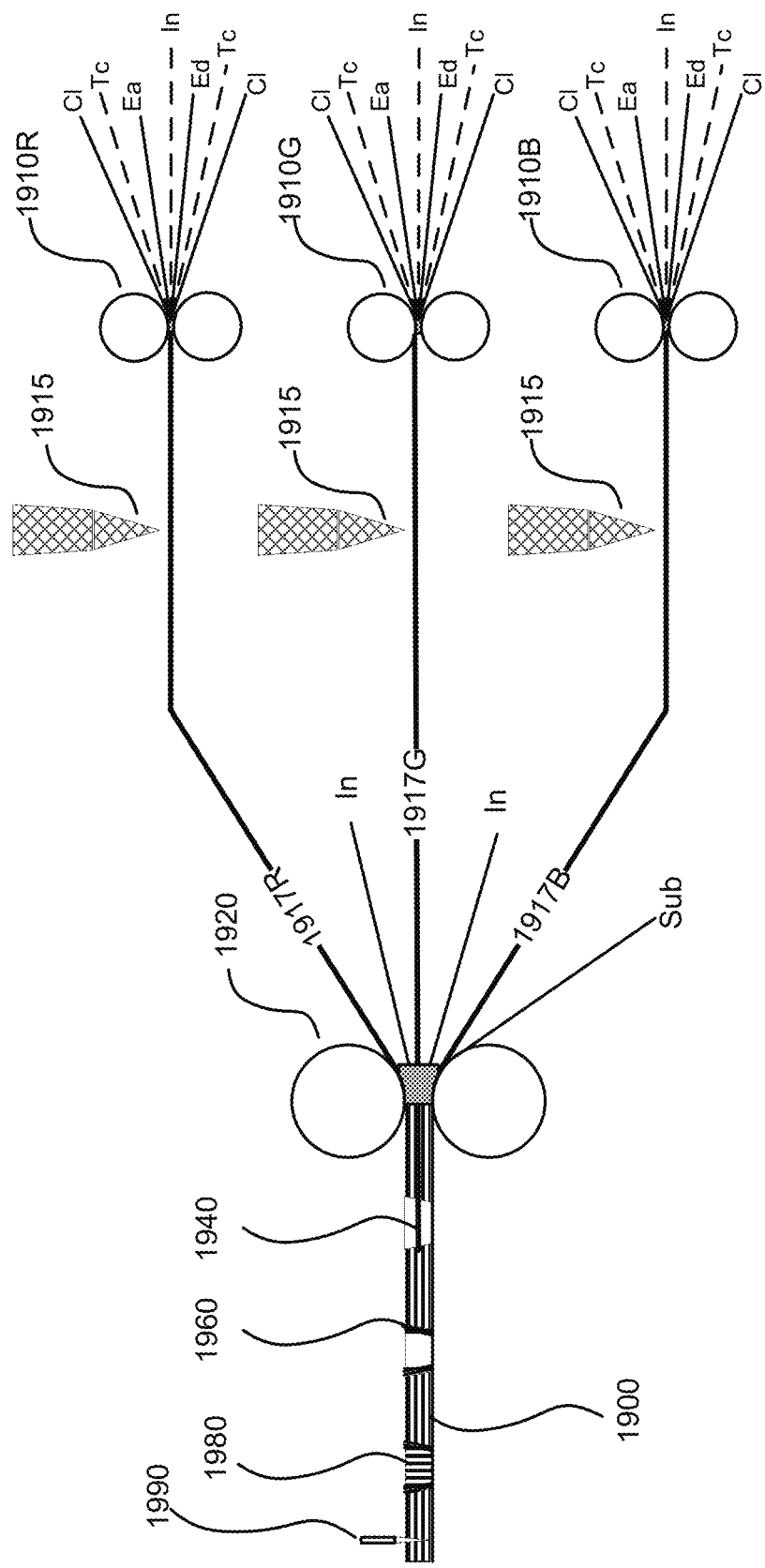
FIG. 5 depicts a simplified manufacturing method of sensors provided with layered, waveguide based detectors.

A simplified example of a method of manufacturing sensors is depicted in FIG. 5. An initial step of laminating the lateral waveguide based detectors for each of the three primary colors Layers of cladding sheet CI, electron acceptor sheet Ea, electron donor sheet ED and another cladding sheet CI are laminated together for each primary color 1910R, 1910G, and 1910B, forming three waveguide based detectors. Optionally other layers are also provided, such as an intrinsic layer In and layers Tc which may be fillers, transparent conductors, and the like.

Conductors are then added 1915 to the individual lateral waveguides 1917R, 1917G, and 1917B, to allow electrical coupling to individual detectors of individual pixels. Adding conductors only to one side is shown, but adding to both sides will be clear to the skilled person.

The individual lateral waveguides are then laminated together 1920, optionally with insulating material In therebetween. A substrate layer is also added. Pits for CRTR's are etched, ion milled, or otherwise formed 1940, and the edges of the pits are coated with cladding material 1960. Core material is added 1980 into the pits, creating the functional CRTR. If fluid is utilized as the core material, a cover is added, however if the selected fluid is air no cover is required. In step 1990, separators are introduced into the detector sheet. By way of example separators may be created by cutting into the sheet to a desired depth, etching and depositing metal or other light blocking material, forcing a material grid, and the like.

Such a lamination method might be particularly feasible for lower frequency imaging arrays wherein the layer thickness will approach those seen in polyimide flex circuits and rectennas may comprise plated through vias in laser drilled passages through the dielectric.

Another method of manufacturing calls for depositing the different layers as required on top of one another, in any desired process such evaporation, chemical, sputter, gas spray, and other deposition methods. Such methods allow constructing the needed conductors and separators using common techniques of deposition-masking-material removal common in the semiconductor and fields. Ion milling or other forming of the CRTR pits is used, and cladding and core materials are deposited.

It is noted that while the figures depict CRTRs with continuously smooth taper, different tapers may be utilized, and logarithmic, radial, non-linear, stepwise and any other arbitrary tapers which would provide the series of successively narrower waveguide regions, would trap waves of successively higher frequencies into resonance and/or emit successively higher frequencies at increasing distances from the aperture. Therefore the invention extends to such embodiments as well.

More complicated waveguides are readily considered having multiple dielectric layers between conductors and are well known in the literature. Similarly waveguides formed between multiple layers of lower dielectric constant are also well known. In certain embodiments the CRTR core will constructed in stepped manner (not shown).

It is further noted that the arrow angles and dimensions in the drawing are provided primarily for clarity only and often do not represent the actual angle of reflected waves.

It should also be noted that the stationary resonant condition can never be reached since, as the energy velocity approaches zero the time scale extends until leakage and loss conditions become dominant. As used in the present application, stationary resonance condition encompasses all conditions beyond which a guided wave cannot pass due to changes in the local waveguide cutoff frequency.

It will be appreciated that the invention is not limited to what has been described hereinabove merely by way of example. While there have been described what are at present considered to be the preferred embodiments of this invention, it will be obvious to those skilled in the art that various other embodiments, changes, and modifications may be made therein without departing from the spirit or scope of this invention and that it is, therefore, aimed to cover all such changes and modifications as fall within the true spirit and scope of the invention, for which letters patent is applied.

We claim:

1. A pixel structure for sensing electromagnetic (EM) radiant energy within a spectral range of interest, the structure comprising:
   a first waveguide having tapered core with an aperture at its wider end for admitting the EM radiant energy, and a depth dimension extending from the aperture towards the narrower end of the core, the core having cladding disposed thereabout, the core and the cladding both being transmissive of EM radiant energy within the spectral range of interest;
   the core being tapered in at least one dimension to cause EM radiant energy in the spectral range admitted via the aperture to reach a cladding penetration state at depths depending on the wavelength of the radiant energy, such that a wave having a longer wavelength would be emitted via the cladding at shallower depth than a wave having a shorter wavelength;
   at least two detectors positioned to receive radiant energy exiting from points at different depths of the cladding and serving to convert the EM radiant energy to an electrical signal, each of the detectors producing an electrical output signal indicative of the intensity of a different band of wavelengths of the EM radiant energy incident on the aperture.

2. A pixel structure as claimed in claim 1, wherein the narrower end shape is selected from a point, a rounded shape, and a flat.

3. A pixel structure as claimed in claim 1, wherein at least one of the detectors comprises a rectenna.

4. A pixel structure as claimed in claim 1 wherein at least one of the detectors is disposed within a second waveguide.

5. A pixel structure as claimed in claim 1 wherein the structure comprises at least a third detector disposed to receive waves of different polarization than at least one of the at least two detectors.

6. A pixel structure as claimed in claim 5 wherein at least a portion of the core has a multi-faceted cross section in a plane substantially parallel to the aperture, and wherein the third detector is disposed at a different angular orientation at the substantially parallel plane, than at least one of the at least two detectors.

7. A pixel structure as claimed in claim 5 wherein at least a portion of the core has an asymmetrical cross section in a plane substantially parallel to the aperture.

8. A pixel structure as claimed in claim 1, wherein the first waveguide is disposed within a plurality of lateral stacked layers, wherein the depth direction is substantially normal to the local plane of the plurality of stacked layers.

9. A pixel structure as claimed in claim 8 wherein the at least two detectors are disposed within the stack.

10. A pixel structure as claimed in claim 8 wherein the stack forms a plurality of layered waveguides, each disposed to receive a different band of wavelengths from the first waveguide.

11. A pixel structure as claimed in claim 10, wherein at least one of the plurality of layered waveguides is dimensioned to have a cutoff frequency lower than the frequency of the lowest frequency wave impinging thereupon from the first waveguide, such that the energy propagation speed along the at least one layered waveguide is reduced to at least 90% of the propagation speed in unrestricted core material of the at least one layered waveguide.

12. A pixel structure as claimed in claim 1 wherein at least one of the detectors is optimized for efficient conversion of the band of wavelengths impinging thereupon.

13. A pixel structure as claimed in claim 1, wherein the core comprises a fluid.

14. A pixel structure as claimed in claim 1, wherein at least one of the detectors is selected from a group consisting of CCD detector, photovoltaic detector, CMOS detector, photodiode detector, phototransistor detector, polymer based detector, organic detector, die based detector, a rectenna based detector, and a combination thereof.

15. A pixel structure as claimed in claim 1 wherein at least one of the detectors is disposed below the narrower end.

16. An image sensor comprising a plurality of pixels having pixel structure as claimed in claim 15, wherein the plurality of pixel structures are disposed above a surface, the surface having at least one of the at least two detectors of at least one of the pixels disposed thereupon or embedded therein.

17. An image sensor comprising a plurality of pixels having pixel structure as claimed in claim 1, wherein the plurality of pixel structures are disposed about a surface.

18. An image sensor as claimed in claim 17, wherein the plurality of pixel structures are at least partially embedded within a stack of layered waveguides.

19. An image sensor as claimed in claim 18, wherein at least one of the detectors of at least one of the plurality of pixels is disposed within at least one waveguide of the stack of layered waveguides.

20. An image sensor for sensing electromagnetic (EM) radiant energy within a spectral range of interest, the sensor comprising:
    a plurality of lateral waveguides having superposed orientation therebetween;
    a plurality of refractors disposed to refract different bands of wavelengths of the EM radiant energy into respective different waveguides;
    a plurality of detectors disposed within the respective lateral waveguides, for producing an electrical signal indicative of the intensity of the band of wavelengths impinged on the respective waveguide.

21. An image sensor as claimed in claim 20, wherein the at least one of the plurality of detectors utilizes rectennas.

22. An image sensor as claimed in claim 20, wherein at least one of the refractors comprises a waveguide having a tapered core and cladding disposed thereabout, the taper being dimensioned to have in at least one dimension, a first width equal to the emission width of a first wave within the spectral range, and a second width equal to the emission width of a shorter wave than the first wave of the spectral range of interest.

23. An image sensor for sensing electromagnetic (EM) radiant energy within a spectral range of interest, the sensor comprising:
    a plurality of superposed waveguides;
    a plurality of tapered waveguides interposed within the plurality of superposed waveguides, each tapered waveguide having a tapered core with an aperture at its wider end for admitting the EM radiant energy, and a depth dimension extending from the aperture towards the narrower end of the core, the core having cladding disposed thereabout, the core and the cladding both being transmissive of EM radiant energy within the spectral range of interest;
    the core being tapered in at least one dimension, to cause EM radiant energy admitted via the aperture, to reach a cladding penetration state at depths depending on the wavelength of the admitted radiant energy, such that a wave having a longer wavelength would be emitted via the cladding at shallower depth than a wave having a shorter wavelength;
    at least two detectors disposed within at least one of the plurality of superposed waveguides, positioned to receive radiant energy exiting from the cladding of the tapered core waveguide, and serving to convert the EM radiant energy to an electrical signal, each detector producing an electrical output signal indicative of the intensity of a different portion of the EM radiant energy admitted via the aperture;
    wherein the tapered waveguides are interposed within the lateral waveguides with their depth direction being substantially normal to the superposed orientation of the lateral waveguides, such that different portions of the EM radiant energy emitted from the tapered waveguide impinge upon different lateral waveguides.

* * * * *